United States Patent [19]

Imamura et al.

[11] Patent Number: 5,158,854
[45] Date of Patent: Oct. 27, 1992

[54] PHOTOSENSITIVE AND HIGH ENERGY BEAM SENSITIVE RESIN COMPOSITION CONTAINING SUBSTITUTED POLYSILOXANE

[75] Inventors: Saburo Imamura; Akinobu Tanaka; Katsuhide Onose, all of Mito, Japan

[73] Assignee: Nippon Telegraph and Telephone Corporation, Tokyo, Japan

[21] Appl. No.: 576,157

[22] Filed: Aug. 29, 1990

Related U.S. Application Data

[63] Continuation of Ser. No. 497,790, Mar. 21, 1990, abandoned, which is a continuation of Ser. No. 233,983, Aug. 11, 1988, abandoned, which is a continuation of Ser. No. 9,475, Feb. 2, 1987, abandoned.

[30] Foreign Application Priority Data

Feb. 7, 1986 [JP] Japan ................... 61-25274
Mar. 14, 1986 [JP] Japan ................... 61-56363
Mar. 24, 1986 [JP] Japan ................... 61-65123
Apr. 12, 1986 [JP] Japan ................... 61-84683
Jun. 12, 1986 [JP] Japan ................... 61-136816

[51] Int. Cl.$^5$ ................... G03F 7/022; G03F 7/023
[52] U.S. Cl. ................... 430/192; 430/165; 430/193; 430/197; 528/26; 528/27; 528/43
[58] Field of Search ............... 430/192, 193, 165, 197, 430/270; 528/26, 27, 43

[56] References Cited

U.S. PATENT DOCUMENTS

| 3,864,292 | 3/1975 | Peters ................... | 430/192 |
| 4,286,049 | 8/1981 | Imamura et al. ................... | 430/325 |
| 4,507,384 | 3/1985 | Morita et al. ................... | 430/311 |
| 4,551,409 | 11/1985 | Gulla et al. ................... | 430/192 |
| 4,564,575 | 1/1986 | Perreault et al. ................... | 430/189 |
| 4,600,285 | 7/1986 | Kitakohji et al. ................... | 430/270 |
| 4,702,990 | 10/1987 | Tanaka et al. ................... | 430/197 |
| 4,722,881 | 2/1988 | Ueno et al. ................... | 430/197 |
| 4,822,716 | 4/1989 | Onishi et al. ................... | 528/43 |

FOREIGN PATENT DOCUMENTS

| 3544165 | 6/1986 | Fed. Rep. of Germany ....... | 430/270 |
| 198446 | 11/1984 | Japan ................... | 430/270 |
| 191245 | 9/1985 | Japan ................... | 430/270 |
| 1238062 | 10/1986 | Japan ................... | 430/270 |

OTHER PUBLICATIONS

Bowden, M. J., *Solid State Technology*, 24, 73 (1981).
Hatzakis, M. et al., "Double Layer Resist Systems for High Resolution Lithography", *Proc. Int. Conf. Microlitho.*, Lausanne, Switzerland, 1981.
Reichmanis, E. et al., *The Society of Photooptical Instru. Eng.*, (SPIC), 469, Advances in Resist Tech., p. 38, 1984.

*Primary Examiner*—Charles L. Bowers, Jr.
*Assistant Examiner*—John S. Chu
*Attorney, Agent, or Firm*—Frishauf, Holtz, Goodman & Woodward

[57] ABSTRACT

Present invention provides a photosensitive and high energy beam sensitive resin composition which may be used as a resist material for forming both of the positive and negative patterns. The resin composition comprises: a substituted polysiloxane having the main polysiloxane chain and a substituent hydrophilic group or groups; and a solvent for the substituted polysiloxane. The substituted polysiloxane used in preferred embodiments of the invention are produced by acylating polysiloxanes including polydiphenylsiloxane and polyphenylsilsesquioxane to introduce acyl groups, followed by oxidation of the thus introduced acyl groups to convert them into carboxyl groups or by reducing the thus introduced acyl groups to convert them into alpha-hydroxyalkyl groups. The acyl, carboxyl or alpha-hydroxyalkyl groups are further substituted to obtain substituted polysiloxanes which are soluble in an aqueous alkali. The photosensitive resin composition of the invention has high sensitivity to a high energy beam, such as electron beam, X-ray and deep ultraviolet ray, and is excellent in resistance to oxygen plasma or other plasmas used in reactive ion etching. The resin composition of the invention may be added with a variety of photosensitive agents, sensitizers and dissolution inhibitors to provide a resist material which has further improved properties.

5 Claims, 1 Drawing Sheet

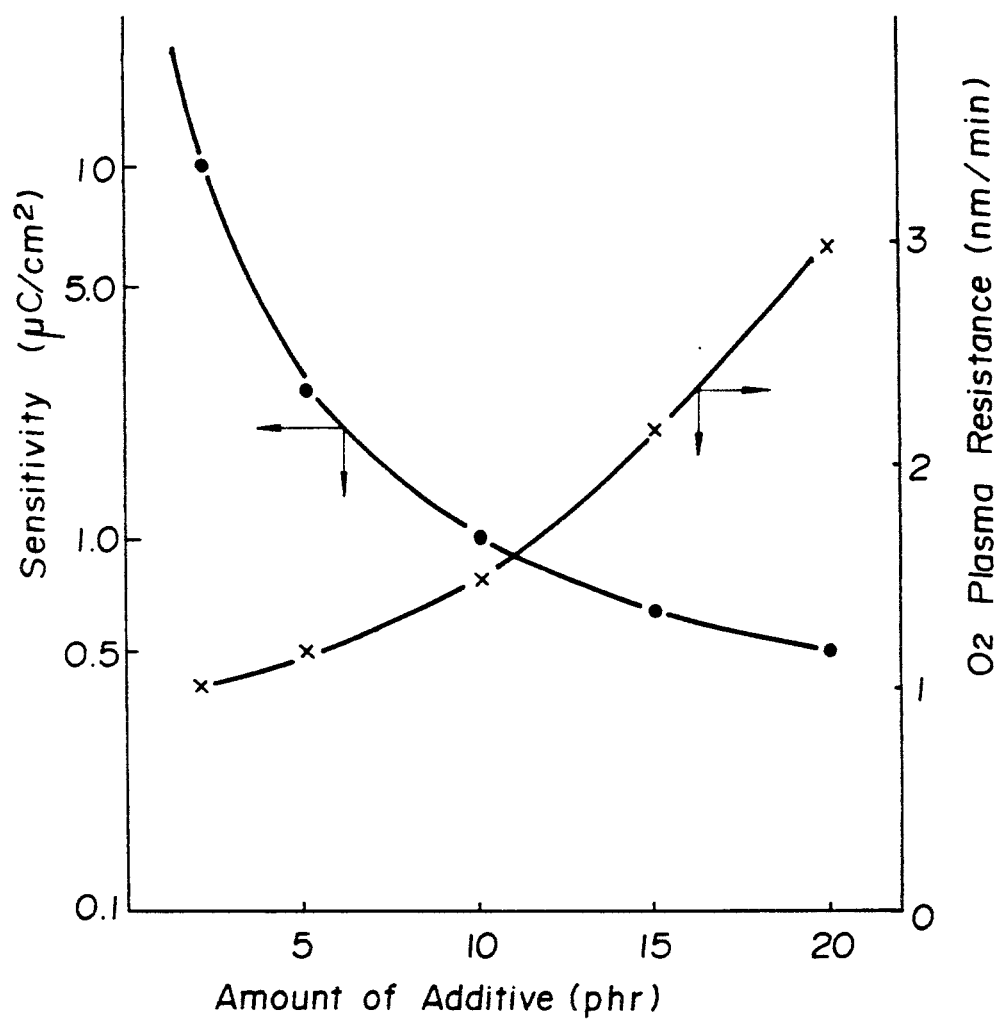

ns:5,158,854

PHOTOSENSITIVE AND HIGH ENERGY BEAM SENSITIVE RESIN COMPOSITION CONTAINING SUBSTITUTED POLYSILOXANE

This application is a continuation of application Ser. No. 07/497,790, filed Mar. 21, 1990, now abandoned, which is a continuation of application Ser. No. 07/733,983 filed Aug. 11, 1988 (abandoned), which is a continuation of application Ser. No. 07/009,475 filed Feb. 2, 1987 (abandoned).

BACKGROUND OF THE INVENTION

1. Field of Art

The present invention relates generally to an improved resin composition adapted as a photoresist material for forming negative or positive pattern, and particularly to such a resin composition which has a noticeable utility as a photoresist material to be exposed to a high energy beam, such as electron beam, X-ray or deep ultraviolet ray (hereinafter simply referred to as "UV" at some portions of this specification), to form an image pattern with high precision and reproducibility. More particularly, it relates to a photosensitive and high energy sensitive resin composition comprising a substituted polysiloxane having a hydrophilic group, such as acyl, carboxyl or hydroxyl, combined with a solvent for the substituted polysiloxane, and optionally added with a photosensitive material, a sensitizer and a dissolution inhibitor.

Polysiloxanes have a repeating unit of —Si—O— in the main chain thereof, and may be referred to as siloxane polymers or silicon-containing polymers.

2. Prior Art Statement

In recent years, there is an increasing demand for a technology and material for the finer pattern formation in fabrication of an integrated circuit (IC), that is an improved photoresist material is demanded as the number of integrated components increases. It is common to fabricate such an IC by a so-called wet process, wherein a substrate is etched by dipping in an etching solution while using photoresist forming a positive or negative pattern as mask. However, due to the side-etching frequently occurred in this wet process, a high quality IC having a fine pattern with satisfactory precision could not be fabricated thereby. In order to exclude this problem and to form a finer and more precise pattern, the recent trend in the electronic industry is toward the use of dry etching processes including the reactive ion etching wherein a gas plasma is used. However, the conventional photoresist is apt to be attacked by the plasma ions to be etched to serious extent for removing the desired portion or portions of the board surface in such a dry etching process. To cope with this undesirable etching of the resist material, a thick resist has been applied. However, the problem of side etching could not be solved by the provision of thick resist for the conventional resist materials. Accordingly, there is a need for a resist material which is improved in resistance or preservability in dry etching process. To our best knowledge, a resist material having satisfactory resistance to gas plasma or ions has not yet been developed.

On the other hand, in order to produce a device having a large number of printed lead wire portions and having a three-dimensional array structure, it is desired that a resist pattern should be formed on an uneven substrate. Thus, it becomes necessary to apply a thicker resist in order to provide a planar surface over an uneven substrate. In a still other case that ion implantation technique is employed to produce a semiconductor device, it becomes necessary to capture the implanted ions until they reach the substrate. It becomes, therefore, necessary to provide a thick resist also in such a processing step. However, since the resolution of the conventional resist was lowered as the thickness thereof increased, it was impossible or hard to form a fine pattern with a high height-to-width aspact ratio.

A proposal for solving the aforementioned problem has been made by M. J. Bowden; "Solid State Technol.", 24, 73 (1981), by which proposed is a process for forming a fine and thick pattern having a high aspect ratio. On the other hand, M. Hatzakis et al, "Proc. Int. Conf. Microlithography", Lausanne (Swiss Federal Institute of Technology, Lausanne, 1981) has reported that polyvinylmethylsiloxane polymer forms a negative tone by an exposure of electron beam. E. Reichmanis has reported in "The Society of Photooptical Instrumentation Engeneering" (SPIC), 469, Advance in Resist Technol., page 38 (1984) that a copolymer of a silicon-containing monomer and methacrylic acid is used as a resist material. On the other hand, U.S. Pat. No. 4,507,384 discloses a pattern forming material mainly composed of a chloromethylated polysiloxane, and suggests a possibility of application of synthetic resins prepared from acryloyloxy methylated siloxane, methacryloxy methylated siloxane, cinnamoyloxy methylated siloxane for resist materials. However, since the known resist materials, particularly polysiloxane-based materials for forming negative patterns including those disclosed by the prior publications as referred to above, have lower glass transition temperatures than the room temperature and low molecular weights, they are generally in liquid or semi-liquid form. As the results, handling of these known resist materials is difficult, and they have low sensitivity to high energy beam light. As the molecular weight of the resist material becomes higher, the material is changed to be rubber-like state to be somehow easily handled and to be improved in sensitivity. However, such a resist material is swelled in a developer solvent, so that their resolution is decreased. Also proposed is the introduction of a functional group, such as vinyl group, on a side chain of the polymer to accelerate the chain reaction in the cross-linking reaction sequence in order to increase their sensitivities. However, such a measure also causes the decrease of resolution.

SUMMARY OF THE INVENTION

An object of this invention is to provide a polysiloxane containing benzene rings having hydrophilic groups.

Another object of this invention is to provide a non-swelling resist material which may be developed by an alkaline developer.

A further object of this invention is to provide a resist material which is improved in resistance to oxygen reactive ion etching.

A still further object of this invention is to provide a resist material which forms a thick pattern of sub-micron size having a high aspect ratio by the photolithography, and to provide a simplified process for forming a pattern by the use of such a resist material.

The polysiloxane containing benzene rings having hydrophilic groups may be prepared by introducing an acyl group into polydiphenylsiloxane or polyphenylsilsesquioxane, and substituting acyl group for hydroxy group or carboxyl group by reducing or oxidating the acylated product.

More specifically, the polysiloxane substituted by or introduced with a hydrophilic residue, provided in accordance with this invention, is the one selected from the group consisting of those represented by the following general structural formula (1) and of :

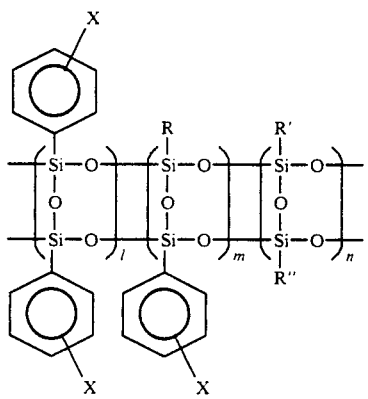
(1)

wherein X is the same or different group and selected from the group consisting of CH₃—CO—or CH₃CH₂(OH) R and R' are same or different groups and independently selected from the group consisting of at least hydroxy and phenyl; R" is a hydrocarbon residue or substituted hydrocarbon residue; and l, m and n are zero or positive integers with the restriction that l and m do not take zero concurrently; and a solvent for said silicone polymer.

Typical examples of the polysiloxane used in this invention are: polyphenylsilsesquioxanes prepared by the hydrolysis of the compounds represented by the general formula of:

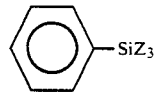

(wherein Z is Cl or OCH₃); diphenylsilanediol; low molecular weight diphenylsiloxanes; diphenylsiloxane oligomers; polymers prepared by the ring-opening-polymerization of cyclic phenylsiloxanes, such as hexaphenylcyclotrisiloxane and octamethyltetrasiloxane; copolymers of tetramethyltetraphenylcyclotetrasiloxane and octamethylcyclotetracyclohexane; and monodispersion polymers prepared by the anion living polymerization of cyclohexane.

Examples of the acylation agent are acetyl chloride, acetic anhydride and propionyl chloride. Friedel-Craft catalysts may be used in this acylation step, the examples being anhydrous aluminium chloride, stannic chloride, ferric chloride, boron trifluoride, zinc chloride and titanium tetrachloride. The acylation reaction may proceed in a solvent, such as chloroform, carbon tetrachloride or trichloroethane. The time required for acylation reaction ranges generally from 30 minutes to 30 hours. After the completion of the reaction, the reaction solution is poured into ice water containing hydrochloric acid. The unreacted chloride is dissolved in water, and then the acylated polymer is filtered. The thus obtained acylated polymer is refined by reprecipitation in a ketone-alcohol mixed solvent.

The acylated polymer may be oxidized, through ordinary process, so that the carbonyl group thereof is converted to carboxyl group. This oxidation step may be carried out in a solvent under reflux, while using, for example, hydrochlorous acid as the oxidizer.

Alternatively, the acylated polymer may be reduced to have α-hydroxyalkyl group. This may be done, for example, in a solvent under reflux while using LiAlH₄ as a reducing agent.

The thus modified polysiloxane containing hydrophilic groups can be dissolved in an alcohol or an aqueous alkali solution.

If such a polysiloxane having hydrophilic group is used as a resist material, the resist can be developed by an alkali. Since the polysiloxane having hydrophilic group, according to this invention, has a siloxane structure on the main chain thereof and also has a benzene ring on the side chain thereof, it is resistant to carbon tetrachloride, carbon tetrafluoride, and oxygen gas plasma. Further, cross-linking reaction takes place upon irradiation of the hydrophilic group with a high energy beam, with the portions which have not been exposed by the beam are left soluble in an alkaline developing solution, and thus the exposed portions of the resist material form a negative pattern by developing with an alkali developing solution.

The bisazides (bisazido compounds) which may be used in this invention are represented by the following general formula (3) of:

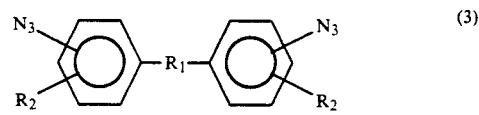
(3)

wherein R₁ is C—C bond, —CH₂—, —O—, —CH= CH—, —N=N—, —S—, SO₂—, —CO—, —CH= CH—CO—CH=CH—,

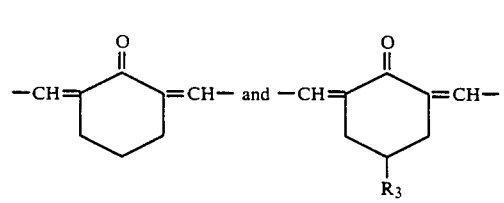

(wherein R₃ is a hydrocarbon or substituted hydrocarbon).

Specific examples of the usable bisazides are:
3,3'-dichloro-4,4'-diazidodiphenylmethane,
4,4'-diazidodiphenyl ether,
4,4'-diazidodiphenylsulfone,
4,4'-diazidodiphenylmethane,
3,3'-diazidodiphenylsulfone,
3,3'-diazidodiphenylmethane,
4,4'-diazidodibenzalacetone,
2,6-di-(4'-azidobenzal)cyclohexanone, and
2,2-di-(4'azidobenzal)-4-tert-amylcyclohexane.

The bisazide is added in an amount of 0.5% to 30%, by weight, based on the weight of the siloxane polymer. If the added amount of bisazide is less than 0.5 wt%, cross-linking reaction does not take place in the resist. On the contrary, if the amount of added azide is in excess of 30 wt%, the resist is detriorated in its stability during long-time storage and has a poor coatability or coating property.

Any of the sensitizers which have been used in the conventional photo-resist may be conveniently used in the resin composition of this invention to increase the sensitivity, the examples being benzoin methyl ether, azobisbutylonitrile, chloophyll, methylene blue, a compound of Eosine Y and sodium p-toluenesulfonic acid, dibenzothiazol disulfide, benzoyl peroxide, benzophenone, Michler's ketone, nitrobenzene, p-nitrophenol, p-nitroaniline, anthracene and 5-nitroacenaphthene.

It is an important feature that the photosensitive resin composition of this invention is highly sensitive to lights, and yet hardly etched by etchant gases used in the reactive ion etching process, such as oxygen gas, carbon tetrachloride gas and $CF_2Cl_2$.

An embodiment of the photosensitive resin composition of this invention, which has an excellent resistance to oxygen plasma and which can reproduce a positive pattern upon exposure to ultraviolet ray at high precision, will now be described.

A positive pattern forming resist may be fabricated by using the substituted polysiloxane having a hydrophilic group, according to this invention, with a ortho-diazonaphthoquinone compound represented by the following general formula (4) of;

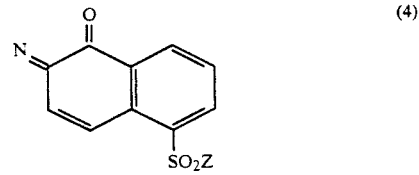

wherein Z is selected from the group consisting of:

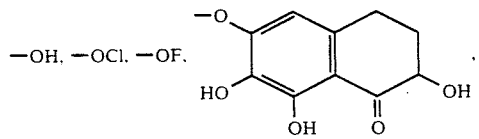

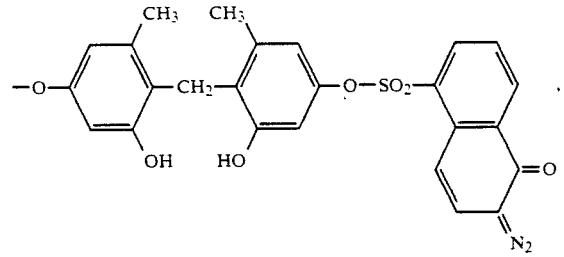

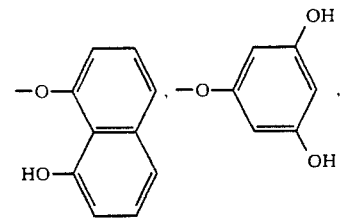

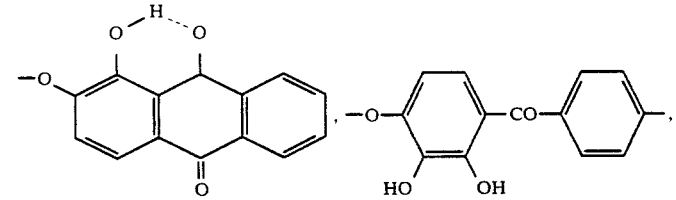

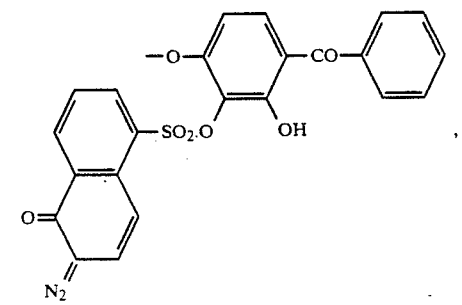

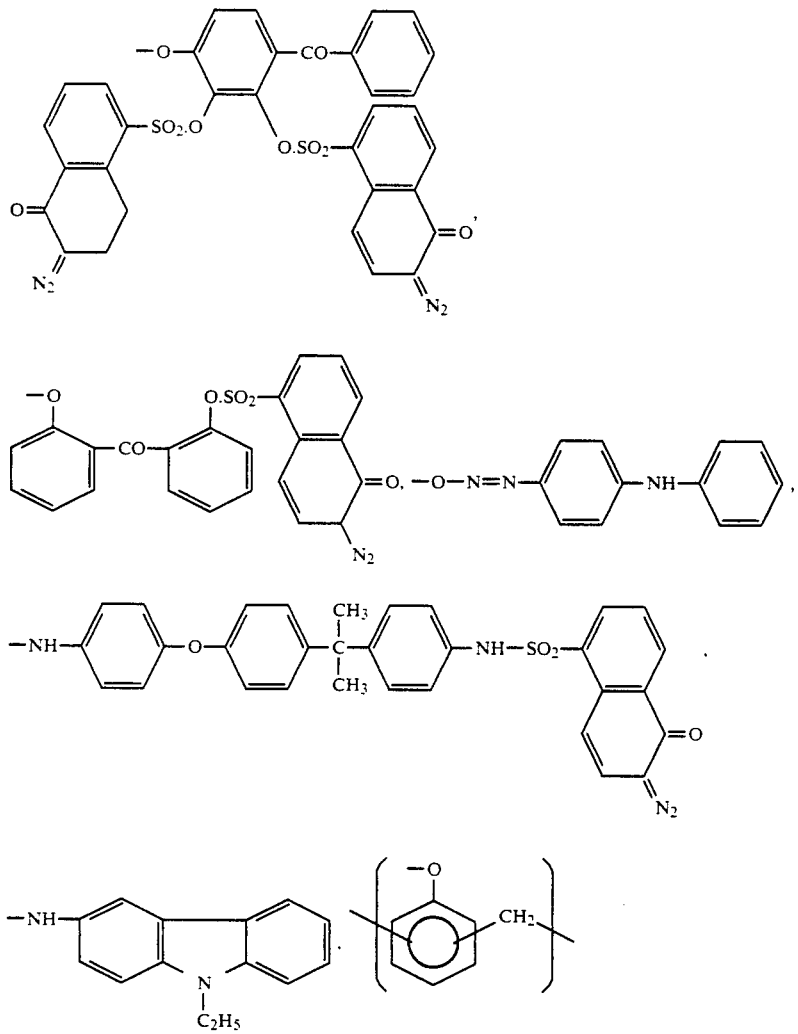

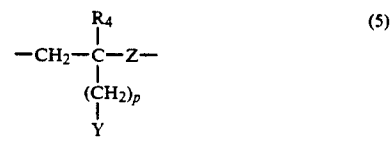

The substituted polysiloxane having a hydrophilic group, used in the composition of this invention, is soluble in an alkali. Accordingly, it may be used as a photo-sensitive resin composition, which forms by the addition of an ortho-diazonaphthoquinone. A positive pattern is formed by the following mechanism. When a composition composed of a substituted polysiloxane having a hydrophilic group added with an ortho-diazonaphthoquinone compound is exposed to UV, the ortho-diazonaphthoquinone compound at the exposed portion is converted into a corresponding indene-carboxylic acid to become soluble in an alkali, As a result, the exposed portion is removed by alkali development to leave a positive pattern.

The ortho-azonaphthoquinone compound serves as a dissolution inhibitor for the resist so as to prevent the resist from dissolution by an alkaline solution. The ortho-azonaphtoquinone compound should be added in an amount of from 5 wt% to 30 wt% of the weight of the polysiloxane. If the added amount is less than 5 wt%, the dissolution of the exposed resist polymer by the alkali developing solution cannot be inhibited to make it impossible to develop the resist by an alkali solution. On the contrary, if the added amount is more than 30 wt%, the content of Si in the resist material is lowered so that the resistance to oxygen plasma is degraded. It is generally preferred that the ortho-diazonaphthoquinone is added in an amount of about 10 wt%.

A high energy beam sensitive resin composition, according to the invention, which may be used to form a fine resist pattern having high aspect ratio on an uneven substrate will now be described below.

Such a resin composition is prepared by adding the substituted polysiloxane having a hydrophilic group, according to this invention, with a polymer acting as a dissolution inhibitor.

Examples of polymers which act as dissolution inhibitors are polymers each having a repeating unit represented by the following general formula (5) of:

$$-CH_2-\underset{\underset{\underset{Y}{|}}{(CH_2)_p}}{\overset{\overset{R_4}{|}}{C}}-Z- \qquad (5)$$

wherein $R_4$ is a hydrogen atom or an alkyl or phenyl; Y is an alkyl or silyl; Z is $-SO_2-$ or $-O-COO-$; and p is zero or a positive integer Further examples of polymers which act as dissolution inhibitors are polyethers each having a repeating unit represented by the following general formula (6) of:

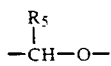
(6)

wherein $R_5$ is hydrogen, an alkyl, phenyl or alkyl containing silicon.

The resist material added with a polymer represented by either one of the general formulae (5) and (6) is insoluble in an aqueous alkali solution. However, the polymers represented by the formulae (5) and (6) are decomposed to be soluble in aqueous alkali solution upon exposure to a high energy beam. As a result, such a polymer serves as a positive type resist. It is preferred that the polymers represented by the fomulae (5) and (6) are added in an amount of 1 wt% to 50 wt%. If the added amount is less than 1 wt%, the effect thereof as a dissolution inhibitor is not exhibited. Conversely, if the added amount thereof exceeds 50 wt%, the content of Si in the entire resin composition becomes too low, leading to a detrimental result that the resistance to oxygen plasma is degraded.

The polymers represented by the general formula (5), wherein Z in the formula (5) is $-SO_2-$, may be prepared by copolymerization of the corresponding olefins with $SO_2$. The copolymerization may be effected at a low temperature in the presence of tert-butyl peroxide or by exposure to a light. Examples of usable olefins include those having vinyl groups, the specific examples being propylene, butene-1, pentene-1, hexene-1, octene-1, trimethylsilylpropylene, trimethylsilylbutene and trimethylsilylethene.

The polymers, which are polycarbonates represented by the general formula (5) and Z in the formula (5) are $-O-CO-O-$, may be prepared by copolymerization of epoxy compounds with $CO_2$. The copolymerization may be effected by dissolving an epoxy compound and $CO_2$ in dioxane, and the solution is added to a diethylzinc/water catalyst system to be polymerized at a temperature range of from $-50°$ C. to $50°$ C. Any of the compounds having epoxide structure, such as epoxy group or glycidyl group, may be used as the epoxy compounds, and specific examples of usable epoxy compounds are glycidyl methacrylate, ethylene oxide, trimethyl(epoxyethyl) silane and trimethyl(epoxypropyl) silane.

On the other hand, a polyether represented by the general formula (6) may be prepared by cationic polymerization of an aldehyde. The polymerization may be effected by dissolving an aldehyde in toluene, followed by cooling to a temperature lower than the ceiling temperature, and added with a cation catalyst such as cobalt(II) acetylacetonate solution or a tertiary amine. Examples of polymerizable aldehyde are formaldehyde, acetoaldehyde, isobutyl aldehyde, hexanal (caproic aldehyde), 3-trimethylsilyl propanal and 4-trimethyl butanal. Further examples of usable polyethers include those which are thermally stabilized by acetylation of the terminal hydroxyl groups.

A photosensitive resin composition comprised of a substituted polysiloxane having a hydrophilic group, a solvent and an ortho-diazonaphthoquinone system compound, according to a further embodiment of this invention, exhibits a photosensitivity of positive type to form a photosensitive polymer membrane. To make use of this property, such a resin composition may be used to form a interlaminar insulation coating or a protection coating, or may be used in a laminated structure to form a multi-layered printed circuit board.

Preparation Example 1

15 g of anhydrous aluminium chloride and 50 ml of acetyl chloride were put into a 300 ml three-neck flask provided with a stirrer, a thermometer and a dropping funnel, followed by stirring. Then, a solution prepared by dissolving 5 g of polyphenylsilsesquioxane in 50 ml of acetyl chloride was dropwisely added slowly from the dropping funnel into the flask. The reaction was continued at 25° C. As the reaction proceeded, hydrogen chloride was generated. After continuing the reaction for 3 hours, the reaction system was cooled, and the content of the flask was poured into ice water containing hydrochloric acid, and then stirred sufficiently to decompose the unreacted aluminium chloride. After ascertaining that the ice water is acidic, the precipitated polymer was filtered, rinsed with a dilute aqueous hydrochloric acid solution, and then dried in a vacuum drier. The weight average molecular weight of the thus prepared polymer was determined through a gel permeation chromatography, to find that it had a weight average molecular weight of $1.2 \times 10^4$. The infrared spectrum of the polymer had a characteristic absorption of siloxane at 1000 to 1200 $cm^{-1}$, an absorption due to stretching vibration of C=C of phenyl at 1600 $cm^{-1}$, and an absorption due to the presence of carbonyl group at 1670 $cm^{-1}$. The result of the NMR (nuclear magnetic resonance) spectroscopy revealed that an absorption due to methyl group was found at $\delta=2.4$ ppm, and absorption due to phenyl group was found at $\delta=6.4$ to 8.4 ppm by "HNMR". On the other hand, the result of "$^{13}$CNMR" revealed that an absorption due to carbon atom of $CH_3$ of acetyl group was found at $\delta=27.0$ ppm, an absorption due to carbon atom of phenyl group was found at $\delta=128$ to 135 ppm, and an absorption due to carbon atom of CO of acetyl group was found at $\delta=207$ ppm. It was thus confirmed that the resultant polymer was acetylated polymer, in view of these results. The result of "HNMR" showed that the acetylation ratio of the polymer was 60%.

The polyphenylsilsesquioxane was prepared in the following procedure. 7 g of phenyltrichlorosilane was dissolved in 20 ml of N-methylpyrrolidone, and then added with 10 ml of $H_2O$ and 5 ml of concentrated hydrochloric acid, followed by maintaining standstill at 30° C. for 24 hours. The resultant precipitate was filtered, rinsed with water, and then dissolved in 20 ml of tetrahydrofuran. The thus obtained solution was added slowly to methanol to obtain a white polymer. The thus obtained polymer, i.e. polyphenylsilsesquioxane, was analysed through a gel permeation chromatography to find that the weight average molecular weight thereof was $\overline{M}_m = 1.0 \times 10^4$, and the ratio between the weight average molecular weight to the number average molecular weight $\overline{M}_w/\overline{M}_n = 1.8$.

PREPARATION EXAMPLE 2

Into a three neck flask provided with a stirrer, a thermometer and a dropping funnel, placed were 25 ml of stannic chloride and 50 ml of acetic anhydride, and the content in the flask was stirred and added slowly from the dropping funnel with a solution prepared by dissolving 6 g of diphenylsilanediol in 50 ml of acetic anhydride. The reaction was continued, while maintaining the reaction system at a temperature of 25° C. After reacting for 3 hours, the reaction system was cooled and then poured into ice water containing hydrochloric acid. The unreacted stannic chloride was decomposed by sufficient stirring, and the precipitating polymer was filtered after ascertaining that the ice water was kept acidic. The thus prepared polymer was rinsed sufficiently while using a dilute aqueous solution of hydrochloric acid, and the polymer was dried in a vacuum drier. The polymer had a weight average molecular weight of 15,000 and the infrared absorption spectrum thereof showed an absorption due to the presence of carbonyl group at 1670 cm$^{-1}$. The result of an NMR spectroscopy showed an absorption due to methyl group at $\delta = 2.4$ ppm. These results revealed that the resultant polymer was an acetylated polymer. The result of NMR spectroscopy revealed that the acetylation ratio of the polymer was 42%. It was estimated that condensation polymerization of diphenylsilanediol and acetylation reaction on the phenyl group took place in this preparation example.

PREPARATION EXAMPLE 3

Six grams of acetylphenylsilsesquioxane prepared in Preparation Example 1 were added to a 10% aqueous solution of sodium hypochloride, and reacted under reflux for 12 hours. The resultant transparent solution was added with hydrochloric acid to bring the solution acidic, whereupon a precipitate was formed. The thus formed precipitate was filtered to obtain a yellowish white solid. The infrared absorption spectrum of the thus formed polymer had an absorption due to carboxyl group at 1700 cm$^{-1}$, while the absorption due to carbonyl group at 1670 cm$^{-1}$ was disappeared. The results reveals that the acetyl group of the starting polymer has been oxidized to be converted to carboxyl group. The yield was 70%.

PREPARATION EXAMPLE 4

Three grams of the acetylated polydiphenylsiloxane prepared in Preparation Example 2 was added to 100 ml of a 10% aqueous solution of sodium hypochloride, and reacted under reflux for 12 hours. The following procedure was similar to that in Preparation Example 3 to oxidize the acetyl group to convert it to carboxyl group. The yield of the polymer was 65%.

The compounds having substituting carboxyl were soluble in an aqueous alkali, methanol and ethanol, but insoluble in other organic solvent.

PREPARATION EXAMPLE 5

Five grams of the acetylpolyphenylsilsesquioxane prepared in Preparation Example 1 were dissolved in 100 ml of tetrahydrofuran, added with 3 g of LiAlH$_4$ (lithium aluminium hydride), and then allowed for standing under reflux for 3 hours. After the completion of reaction, the reaction solution, was slowly added to ice water containing 5% of hydrochloric acid to obtain a yellowish white solid. The yield of the polymer was 55%.

The infrared spectrum of the thus obtained polymer had an absorption due to —OH near 3100 to 3400 cm$^{-1}$, and the absorption due to carbonyl group at 1670 cm$^{-1}$ disappeared. Redudction of acetyl group was thus confirmed.

PREPARATION EXAMPLE 6

Five grams of the acetylated polydiphenylsiloxane prepared in Preparation Example 2 was dissolved in 100 ml of tetrahydrofuran, added with 3 g of LiAlH4, and allowed to stand under reflux after then. After the completion of reaction, the reaction system was poured into ice water containing 5% of hydrochloric acid to obtain a yellowish white solid. The yield of the polymer was 66%. The polymers prepared in Preparation Examples 5 and 6 were soluble in an aqueous alkali solution, methanol and ethanol.

PREPARATION EXAMPLE 7

Similarly as in Preparation Example 1, except that polydiphenylsiloxane (having a molecular weight of $8.9 \times 10^2$) obtained by ring-opening-polymerization of hexaphenylcyclotrisiloxane was used in place of the polyphenylsilsesquioxane as used in Preparation Example 1, acetylation was effected while using acetyl chloride to obtain acetylated polydiphenylsiloxane. The ring-opening-polymerization was carried out in the following manner. 10 g of hexaphenylcyclotrisiloxane was dissolved in 100 ml of toluene, sufficiently degassed and dehydrated in a reaction vessel, and then dropwisely added with 5 ml of a 10% solution of lithium butylate in toluene. The reaction system was then allowed to react for 10 hours for living polymerization, and then poured into methanol to obtain polydiphenylsiloxane in a white solid form. The thus obtained product was refined by repeated reprecipitation using methanol. The refined polymer was then dried in vacuum. The thus obtained polymer was subjected to gel permeation chromatography to find that it had a weight average molecular weight $\overline{M}_w$ of $8.9 \times 10^2$, the degree of dispersion indicated by $\overline{M}_n/\overline{M}_n$ thereof was 1.1.

PREPARATION EXAMPLE 8

Generally following to the procedure as described in Preparation Example 1, except that propionyl chloride was used in place of acetyl chloride, propionylated polyphenylsilsesquioxane was prepared.

PREPARATION EXAMPLE 9

Generally following to the procedure as described in Preparation Example 7, except that propionyl chloride was used in place of acetyl chloride, propionylated polydiphenylsiloxane was prepared.

EXAMPLE 1

The resist materials prepared, respectively, in Preparation Examples 1 to 9 were dissolved in ethyl cellosolve acetate, and then added with 20 wt% of a derivative of ortho-diazonaphthoquinone represented by the following formula of:

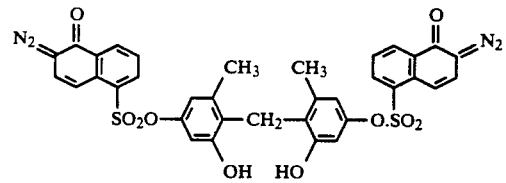

Each of the thus prepared resist materials was coated on a silicon wafer to form a thin resist coating having a thickness of 0.2 microns. The thin coating was prebaked at 80° C. for 20 hours, and then the coating was exposed to UV (ultraviolet ray) emitted from Jet Light produced by Oak Co. After exposure, the resist was developed by an alkali solution prepared by mixing a commercially available Microposit 240 (produced by Sipley Corp.) with water in a mixing ratio of 1:1. The ortho-diazonaphthoquinone acted as a so-called dissolution inhibitor to be decomposed by exposure to UV, whereupon the decomposed ortho-diazonaphthoquinone at the portion exposed to UV loses its function as a dissolution inhibitor to allow the resist composition at that exposed portion to be soluble in a solvent. Since the resist materials of this Example serves as positive type resists, the sensitivities are determined such that the radiation dose at which the remaining coating thickness of the exposed portion is zero, are taken as the sensitivities of respective resists.

The sensitivites, determined in the aforementioned manner, are shown together with the resolving powers of respective resist materials. The resolving power is appraised by forming a line-and-space pattern. Patterns each having width of 0.5 micron could be formed on all of the resists of this Example.

TABLE 1

Used Resists: Photosensitive Resin Compositions
Composed of Ethyl Cellosolve Acetate
and Respective Ortho-diazonaphtoquinone
Derivatives.
Interrelation between the Sensitivity and the
Resolution Power of the Resist Exposed to UV
are shown.

Preparation

TABLE 1-continued

| Example No. | 1 | 2 | 3 | 4 | 5 | 6 | 7 | 8 | 9 |
|---|---|---|---|---|---|---|---|---|---|
| Sensitivity ($mJ/cm^2$) | 50 | 50 | 40 | 30 | 40 | 40 | 50 | 50 | 50 |
| Resolution (micron) | 0.5 | 0.5 | 0.5 | 0.5 | 0.5 | 0.5 | 0.5 | 0.5 | 0.5 |

EXAMPLE 2

The acetylated polyphenylsiloxane prepared in Preparation Example 1 was added with 20 wt% for each of the derivatives of ortho-azonaphthoquinone represented by the following general formula of:

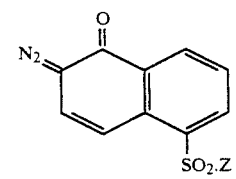

Respective derivatives of ortho-azonaphthoquinone used in this Example had the following group as the substituent Z. Generally similarly as in Example 1, the sensitivities to UV were determined. The results are shown in Table 2.

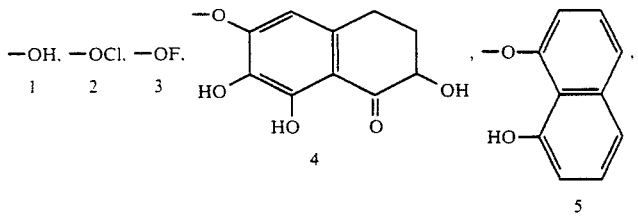

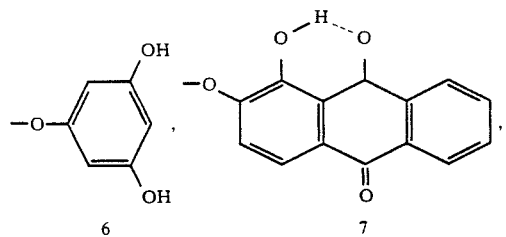

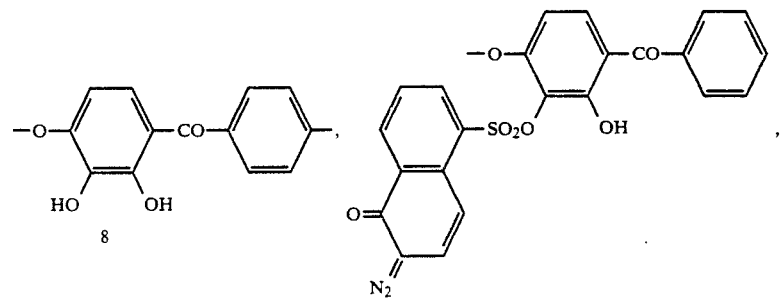

-continued

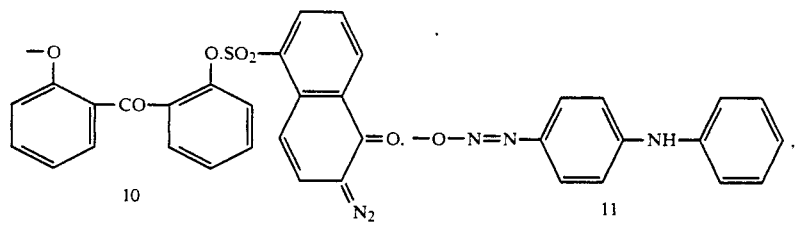
10, 11

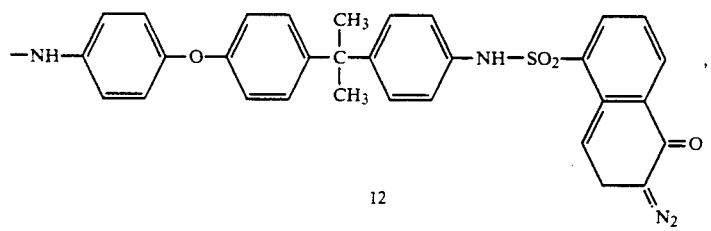
12

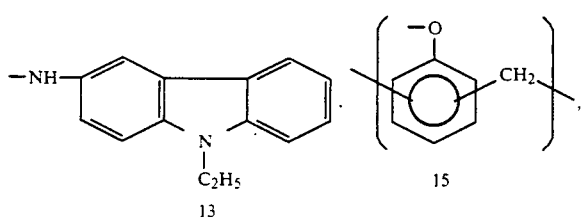
13, 15

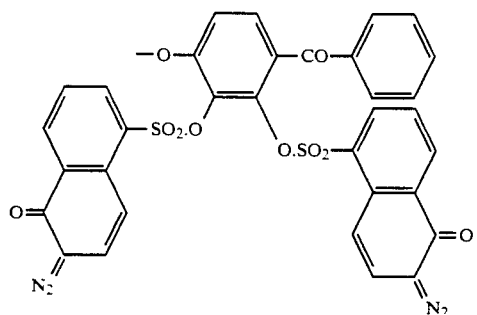
14

TABLE 2

Used Resists: Photosensitive Resin Compositions
Composed of Ethyl Acetate Cellosolve and
the Ortho-diazonaphtoquinone Derivatives.
Each Having Different Group Z
Interrelation between the Sensitivity and the
Resolution of the Resist Exposed to UV are Shown.

| Substuent Z | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Sensitivity (mJ/cm$^2$) | 190 | 140 | 75 | 30 | 35 | 40 | 20 | 30 | 8 | 13 | 20 | 8 | 25 | 8 | 70 |

EXAMPLE 3

A commercially available resist (AZ-1350 produced by Shipley Corp.) was coated on a silicon wafer to form a thick coating having a thickness of 2 microns. The thick coating was heated at 200° C. for 30 minutes. The same resist material as used in Example 2 was coated over the AZ resist to form a thin overcoat having a thickness of about 0.2 microns, similarly as in Example 2. The overcoat was then pre-baked at 80° C. for 20 minutes. Thereafter, the resist coating was exposed to UV through a chromium mask having 0.5 μm line-and-space pattern. The thus exposed resist was developed by the developer having the same composition as that used in Example 2, whereby the mask pattern was transferred to the AZ resist. Then, using a parallel plate type sputter etching apparatus, the AZ resist was etched by using oxygen as an etchant while utilizing the resist pattern as a mask. The etching was effected for 15 minutes under the condition that the power of RF was 0.2 W/cm$^2$ and the pressure of O$_2$ was 20 millitorr. The result was that the portion of the AZ resist uncovered with the resist pattern was completely removed. Irrespective of either one of the resist materials set forth in Example 2 was used, a pattern having a 0.5 μm line-andspace pattern with 2 microns in thickness could be formed.

EXAMPLE 4

The polydiphenylsiloxane prepared by Preparation Example 7 and having a weight average molecular weight $\overline{M}_w$ of $8.9 \times 10^2$ and a degree of dispersibility $\overline{M}_w/\overline{M}_n$ of 1.1 was acetylated using anhydrous AlCl$_3$ and acetyl chloride 2g of acetylpolydiphenylsiloxane was dissolved in 10 ml of ethyl cellosolve. The thus prepared solution was added with 500 mg of 3,3'-dichloro-4,4'-diazidodiphenylmethane and 30 mg of Michler's ketone which acted as a sensitizer. The thus prepared mixed solution was coated on a quarz plate to form a thin coating having a thickness of about 0.5 micron. The thin coating was pre-baked at 80° C. for 20 minutes in a nitrogen air flow. The coating was then exposed to UV in an N$_2$ atmosphere through a mask, Kodak Photographic Step Tablet, while using an ultra high pressure mercury lamp. The quarz plate was dipped in an aqueous solution of tetramethylammonium hydroxide for 60 seconds, and then rinsed with water for 30 seconds. The exposed portion of the thin coating was cross-linked to become insoluble, so that the thin coating of the resist served as a so-called negative type resist. The irradiation or exposure dose, at which 50% of the thickness of the initial coating was left, was 15 mJ/cm$^2$. A further experiment was conducted, in which the coating was exposed to UV through a chromium mask having a line-and-space pattern having the line widths and space gaps of less than 1.0 micron and then the exposed image was developed by the same developer composition, whereby the mask pattern was resoluted at high fidelity.

EXAMPLE 5

This Example is given to show that the polysiloxane having a hydrophilic group, such as acyl, carboxyl or alkyl having hydroxyl group, taught by the present invention, can be used in a double-layered resist.

A commercially available AZ-1350 resist (produced by Shepley Corp.) was coated on a silicon wafer to form a thin coating having a thickness of 2 microns. The thin coating was heated at 200° C. for 30 minutes, and then overcoated with the photosensitive resin composition containing the acetylpolydiphenylsiloxane as used in Example 3 in a manner similar to that described in the preceding Examples to form a 0.3 micron thick coating which was pre-baked at 80° C. for 20 minutes in an N$_2$ flow. Then, the resist coating was exposed to light through a chromium mask having a pattern constituted of leas than 1.0 micron lines and spaces. The following developing operation was similar to that employed in Example 4, whereby the mask pattern was transferred onto the AZ resist coating. Etching was then effected in a parallel plate type sputter etching apparatus using O$_2$ as an etchant under the condition that the applied power was 50 W and the pressure in the etching chamber was 80 milli-torr. The etching rate of the photosensitive resin composition of this invention was not more than 10 nm/min. On the contrary, the etching rate of the AZ resist was 1500 angstrom/min. After the lapse of 15 minute etching time, the portion of the AZ resist which had not been covered with the photosensitive resin composition of this invention was completely etched away. As a result, a pattern having a height of about 2.3 microns was formed.

EXAMPLE 6

Generally following to the procedure as described in Example 4, polymers prepared by Preparation Examples 1, 2, 3, 4, 5, 6, 8 and 9 were used in place of the acetylpolydiphenylsiloxane prepared by Preparation Example 7 as used in Example 4, resists were formed, exposed to light and then developed. Since the thus formed resists were so-called negative type resists, the exposure doses at which 50% of the initial thicknesses were left were determined. The results are shown in Table 3. A further experiment was conducted, in which the coating was exposed to light through a chromium mask having a 1.0 μm line-and-space pattern and then the exposed image was developed. The results were that the mask images were transferred into the resist with high fidelity when any of the aforementioned polymers were used. Similarly as in Example 4, patterns each having a height of about 2.3 microns could be formed.

TABLE 3

Used Resists: Photosensitive Resin Compositions
Composed of the Following Ingredients:
Polymer: Substituted Polysiloxane
Solvent: Ethyl Acetate Cellosolve
Photosensitive Agent: 3.3'-dichloro-
4,4'-diazidediphenylmethane
Sensitizer: Michler's Ketone

| Used Polymer (Preparation Example No.) | 1 | 2 | 3 | 4 | 5 | 6 | 7 | 8 | 9 |
|---|---|---|---|---|---|---|---|---|---|
| Sensitivity (mJ/cm$^2$) | 16 | 17 | 10 | 11 | 12 | 13 | 15 | 20 | 20 |

EXAMPLE 7

Generally following to the procedure as described in Example 4, photosensitive resin compositions were prepared by using the following photosensitive agents in place of 3,3'-dichloro-4,4'-diazidediphenylmethane.
1. 4,4'-diazidodiphenyl ether
2. 4,4'-diazidodiphenyl sulfone
3. 4,4'-diazidodiphenyl methane
4. 3,3'diazidodiphenyl sulfone
5. 3,3'-diazidodiphenyl methane
6. 4,4'-diazidodibenzal acetone
7. 2,6-di-(4'-azidobenzal)cyclohexane
8. 2,6-di-(4'azidobanzal)-4-methylcyclohexanone
9. 2.6-di--(4'-azidobenzal)-4-tert-amylcyclohexanone Each of the resists was irradiated by a 3 KW ultra high pressure mercury lamp, and then the thus exposed resists were developed. Determined were the photosensitivities and the irradiation (exposure) doses at which the thickness of the coating was reduced to 50% of the initial thicknesses. The results are shown in Table 4.

TABLE 4

Used Resists: Photosensitive Resin Compositions
Composed of the
Acetylpolydiphenylsiloxane prepared by
Preparation Example 7, Ethyl Cellosolve,
Michler's Ketone Serving as Sensitizer
and Respective Photosensitive Agents Set
Forth Hereinabove.
Interrelation between the Specific Kind of
Photosensitive Agent and the Sensitivity of
the Resultant Resin Composition:

| Photosensitive Agent No.) | 1 | 2 | 3 | 4 | 5 | 6 | 7 | 8 | 9 |
|---|---|---|---|---|---|---|---|---|---|
| Sensitivity | 18 | 30 | 25 | 28 | 20 | 10 | 14 | 12 | 11 |

EXAMPLE 8

Two grams of the acetylpolydiphenylsiloxane prepared by Preparation Example 7 were dissolved in 10 ml of ethyl cellosolve acetate. Similarly as in Example 7, resin composition were prepared by adding the solution with 500 ml of 2,6-di-(4'-azidobenzal)-4-methylcyclohexanone acting as a photosensitive agent and either one of the following compounds, in place of Michler's ketone, as sensitizers. Each of the thus prepared resin compositions was coated on a substrate, exposed to light and then developed.
1. 5-Nitroacenaphthene
2. 2-Nitrofulorene
3. 1-Nitropyrene
4. 1,8-Dinitropyrene
5. 1,2-Benzoanthraquinone
6. Pyrene-1,6-quinone
7. Cyanoacridine
8. No sensitizer added Determined were the photosensitivities and the exposure doses at which the thicknesses of the coatings were reduced to 50% of the initial thicknesses. The results are shown in Table 5.

TABLE 5

Used Resists: Photosensitive Resin Compositions Composed of the Acetylpolydiphenylsiloxane prepared by Preparation Example 7, Ethyl Cellosolve acetate, 2,6-di(4'-azidobenzal)-4-methylcyclohexa none and the sensitizer 1 to 8 set forth above in place of the Michler's Ketone to Serve as Sensitizers. Interrelation between the Specific Kind of Sensitizer Used and the Sensitivity of the Resultant Resin Composition:

| Sensitizer | 1 | 2 | 3 | 4 | 5 | 6 | 7 | 8 |
|---|---|---|---|---|---|---|---|---|
| Sensitivity ($mJ/cm^2$) | 28 | 39 | 9 | 8 | 9 | 10 | 7 | 50 |

EXAMPLE 9

Resist coatings each formed of a photosensitive resin composition composed of the acetylpolydiphenylsiloxane, ethyl Cellosolve acetate (solvent), 2,6-di-(4'-azidobenzal)-4-methylcyclohexanone, and Michler's ketone (sensitizer) was exposed to light, while using photo-masks having different thicknesses ranging from 0.5 micron to 3.0 microns, as tabulated in Table 6. Each of the thus exposed resist coatings was developed to obtain a developed pattern. The sizes of the developed patterns formed by the use of respective photo-masks are shown in Table 6.

TABLE 6

| Size of Mask Pattern (micron) | Size of Developed Pattern (micron) |
|---|---|
| 0.5 | Not Resolved |
| 0.6 | 0.55 |
| 0.7 | 0.68 |
| 0.8 | 0.76 |
| 0.9 | 0.89 |
| 1.0 | 1.0 |
| 2.0 | 2.0 |
| 3.0 | 3.0 |

For comparison purpose, similar tests were conducted using polyvinylmethylsiloxane in place of the acetylpolydiphenylsiloxane prepared by Preparation Example 7 and used in the embodiments of this invention as set forth in Table 6. The comparative tests revealed that the comparative resists were swelled so much that the resists lost their resolution when maskpatterns had thicknesses of less than 3.0 microns.

EXAMPLE 10

Patterns formed in a manner similar to that described in Example 4 were subjected to reactive ion etching, while using (1) $CF_4$, (2) $CF_2Cl_2$, (3) $CCl_4$ (4) $O_2$ and (5) Ar, as etchant gases. The conditions for etching operation and the etching speed of the photosensitive resin composition are shown in Table 7.

TABLE 7

| No. | Etchant Gas | Pressure (milli-torr) | Power (W) | Etching Speed (A/min) |
|---|---|---|---|---|
| 1 | $CF_4$ | 20 | 100 | 400 |
| 2 | $CF_2Cl_2$ | 100 | 150 | 75 |
| 3 | $CCl_4$ | 200 | 150 | 20 |
| 4 | $O_2$ | 80 | 50 | 5 |
| 5 | Ar | 10 | 100 | 100 |

EXAMPLE 11

Generally following to the procedure as described in Example 4, except that an electron beam source, an X-ray beam source and a deep UV beam source were used in lieu of the ultra high pressure mercury lamp used as light source in Example 4, experiments were conducted to find the exposure doses of respective light beams at which the thickness of the coating was reduced to 50% of the initial thickness. The results are shown in Table 8.

Resist patterns when exposed to either one of the high energy light beams as set forth in Table 8, were also appraised to know that pattern fineness of not more than 0.5 microns could be resolved irrespective of the used high energy beams.

TABLE 8

| No. | Beam Source | Exposure Dose of High Energy Beam |
|---|---|---|
| 1 | Electron Beam, Acceleration Voltage: 20 KV | $5 \times 10^{-5}$ $C/cm^2$ |
| 2 | X-ray, Cu 1-Ray, 13.3 A | 50 $mJ/cm^2$ |
| 3 | Deep UV, 1 KW, Xe—Hg Lamp | 10 $mJ/cm^2$ |

EXAMPLE 12

The resist materials prepared by Preparation Examples 1 to 9 were dissolved in ethyl cellosolve acetate From each of the thus obtained resist solutions was coated on a silicon wafer by spin coating to form a 0.2 micron thick coating which was pre-baked at 80° C. for 20 minutes. It is to be noted hereby that the embodiments in this Example are not added with any photosensitive agent. Each of the coatings was exposed to a high energy beam, such as an electron beam, X-ray or deep UV. After exposure, the exposed resist was developed by a developing solution prepared by mixing water with a commercially available Microposit (produced by Shepley Corp.) at a mixing ratio of 1:1.

Since the resists of this Example act as so-called negative type resists, the sensitivity of each resist has been determined by learning the exposure dose at which the thickness of the residing resist reaches to 50% of the initial thickness. The resolution in the following Table 9 is shown by the smallest size of the line-and-space pattern which could be resolved. The results are shown in Table 9.

4. Polycarbonate prepared by condensation polymerization of 2,5-Dimethylhexane-2,5-diol and p-benzenemethanol
5. Polycarbonate prepared by the reaction between ethylene oxide and $CO_2$
6. Polyether prepared by the polymerization of formaldehyde
7. Polyether prepared by the polymerization of acetoaldehyde
8. Polyether prepared by the polymerization of hexanal
9. Polyether prepared by the polymerization of 3-trimethylsilylpropanal Similarly as in Example 13, the sensitivity to an electron beam and the resistance to oxygen plasma were measured. The results are shown in Table 10.

TABLE 9

| Working Example | | Electron Beam | | X-ray | | Deep UV | | $O_2RIE^{*1}$ |
|---|---|---|---|---|---|---|---|---|
| No. | $X^{*2}$ | $D_o^{*3}$ | $R^{*4}$ | $D_o^{*5}$ | $R^{*4}$ | $D_o^{*6}$ | $R^{*4}$ | (nm/min) |
| 1 | $CH_3CO-$ | 2 | 0.2 | 60 | 0.3 | 20 | 0.4 | 2.5 |
| 2 | $CH_3CO-$ | 3 | 0.2 | 60 | 0.3 | 20 | 0.4 | 2.5 |
| 3 | $-COOH$ | 6 | 0.3 | 65 | 0.3 | 30 | 0.4 | 2.0 |
| 4 | $-COOH$ | 10 | 0.3 | 80 | 0.3 | 50 | 0.4 | 2.0 |
| 5 | $CH(OH)CH_3$ | 7 | 0.2 | 70 | 0.3 | 40 | 0.4 | 2.0 |
| 6 | $CH(OH)CH_3$ | 8 | 0.2 | 75 | 0.3 | 40 | 0.4 | 2.5 |
| 7 | $CH_3CO-$ | 2 | 0.4 | 60 | 0.4 | 30 | 0.4 | 2.5 |
| 8 | $CH_3CH_2CO-$ | 3 | 0.3 | 60 | 0.3 | 30 | 0.4 | 2.5 |
| 9 | $CH_3CH_2CO-$ | 3 | 0.3 | 60 | 0.3 | 20 | 0.4 | 2.0 |

Note.
*[1]Etching Speed (nm/min)
*[2]Substituting Group
*[3]Sensitivity ($\mu C/cm^2$)
*[4]Resolution ($\mu m$)
*[5]Sensitivity ($mJ/cm^2$)
*[6]Sensitivity ($mJ/cm^2$)
7 Acetylpolydiphenylsiloxane (Acetylated Product of Living Polymer)
8 Propionylpolyphenylsesquioxane
9 Propionylpolydiphenylsiloxane

EXAMPLE 13

Ten grams for each of the polymers prepared by Preparation Examples 1 to 9 were added with one gram for each of polybutenesulfone, and dissolved in ethyl cellosolve acetate to prepare a resist material solution which was coated on a silicon wafer by spin coating to form a thin coating having a thickness of about 0.2 micron. The coating was then pre-baked at 80° C. for 20 minutes, and exposed to a high energy beam, such as an electron beam, X-ray or deep UV. After exposure, the exposed coating was developed by a developing solution prepared by mixing water with a commercially available Microposit (produced by Shepley Corp.) at a mixing ratio of 1:1.

Since the resists of this Example act as so-called positive type resists, the sensitivity of each resist has been determined by learning the exposure dose at which the thickness of the residing resist coating reaches to zero. The sensitivities and the resolution of the embodiments of this Example were substantially equivalent to those shown in Table 9.

EXAMPLE 14

Each of the ethyl cellosolve solutions of the polymers prepared by Preparation Examples 1 to 9 was added with 1 g of one of the following compounds as a dissolution inhibitor, in place of the polybutenesulfone as used in Example 13, whereby a high energy beam sensitive resin composition was prepared.
2. Polymethylpentenesulfone
3. Polytrimethylsilylvinylsulfone,

TABLE 10

Interrelation between the Sensitivity $D_o$ ($\mu C/cm^2$) to the Electron Beam and the $O_2RIE$ (Etching Speed (nm/min)) of Resist Materials by Combining Polymers Prepared by Preparation Example 1 to 9 with Ethyl Cellosolve and Various Dissolution Inhibitors

| Dissolution Inhibitor No. | Preparation Example No. | | | | | | | | |
|---|---|---|---|---|---|---|---|---|---|
| | 1 | 2 | 3 | 4 | 5 | 6 | 7 | 8 | 9 |
| 2. $D_o$ ($\mu C/cm^2$) | 1 | 2 | 5 | 9 | 6 | 7 | 1 | 2 | 2 |
| $O_2RIE$ | 3 | 3 | 2.5 | 2.5 | 2.5 | 3.0 | 3.0 | 3.0 | 2.5 |
| 3. $D_o$ ($\mu C/cm^2$) | 3 | 4 | 7 | 10 | 8 | 9 | 3 | 5 | 4 |
| $O_2RIE$ | 2 | 2 | 1.5 | 1.5 | 1.5 | 2.0 | 2.0 | 2.0 | 1.5 |
| 4. $D_o$ ($\mu C/cm^2$) | 4 | 5 | 9 | 9 | 7 | 8 | 5 | 6 | 6 |
| $O_2RIE$ | 3 | 3 | 2.5 | 3 | 3 | 3 | 3 | 3 | 2.5 |
| 5. $D_o$ ($\mu C/cm^2$) | 3 | 3 | 6 | 7 | 5 | 6 | 3 | 3 | 4 |
| $O_2RIE$ | 2.5 | 3 | 3 | 2.5 | 3 | 3 | 2.5 | 2.5 | 3 |
| 6. $D_o$ ($\mu C/cm^2$) | 2 | 3 | 5 | 6 | 4 | 4 | 2 | 3 | 3 |
| $O_2RIE$ | 3 | 3.5 | 3 | 3 | 3.5 | 3 | 3 | 2.5 | 2.5 |
| 7. $D_o$ ($\mu C/cm^2$) | 1 | 2 | 3 | 5 | 3 | 4 | 1 | 1 | 1 |
| $O_2RIE$ | 3 | 3 | 3 | 3 | 3.5 | 3 | 3 | 2.5 | 3 |
| 8. $D_o$ ($\mu C/cm^2$) | 1 | 1 | 2 | 3 | 2 | 2 | 1 | 1 | 1 |
| $O_2RIE$ | 3 | 2.5 | 3 | 2.5 | 3.0 | 2.5 | 2.5 | 2.5 | 2.5 |
| 9. $D_o$ ($\mu C/cm^2$) | 1 | 2 | 3 | 4 | 3 | 3 | 1 | 1 | 1 |
| $O_2RIE$ | 2 | 1.5 | 2 | 1.5 | 2 | 1.5 | 1.5 | 1.5 | 1.5 |

EXAMPLE 15

One gram for each of the silicon-containing polycarbonates, as set forth in the following Table 11, was added to a solution of acetylpolyphenylsilsesquioxane prepared by Preparation Example 1, in a ratio that one gram of the polycarbonate was added to the solution containing ten grams of the acetylpolyphenylsilsesquioxane. The sensitivities of the thus prepared resin compositions were determined similarly as in Example 13. The results are shown in Table 11.

TABLE 11

| No. | Silicon-Containing Polycarbonate Structural Formula | Sensitivity ($\mu C/cm^2$) |
|---|---|---|
| 1 | $-CH_2-CH(Si(CH_3)_3)-O-C(=O)-O-$ | 1.0 |
| 2 | $-CH_2-CH(CH_2Si(CH_3)_3)-O-C(=O)-O-$ | 1.0 |
| 3 | $-CH_2-CH(Si(C_2H_5)_3)-O-C(=O)-O-$ | 1.5 |
| 4 | $-(CH(Si(CH_3)_3)-CH-O-C(=O)-O)_n-(CH_2-CH(CH_2-Si(CH_3)_3)-O-C(=O)-O-O)_m-$ | 2.0 |
| 5 | $-(CH(Si(CH_3)_3)-CH-O-C(=O)-O)_n-(CH_2-CH(Si(C_2H_5)_3)-O-C(=O)-O-O)_p-$ | 2.0 |

EXAMPLE 16

Resist solutions were prepared using the No. 1 silicon-containing polycarbonate as used in the preceding Example 15, while varying the concentration thereof. The interrelation between the change in added quantity of the polycarbonate and the changes in sensitivity to an electron beam and in resistance to oxygen plasma are plotted in FIG. 1. As shown in the Figure, as the added quantity of polycarbonate increases, the sensitivity is improved, but the resistance to oxygen plasma is degraded. However, since the used polycarbonate contains Si, degradation of resistance to oxygen plasma is suppressed at a moderate level. If a polycarbonate, which does not contain Si, is used, the degradation or depression in resistance to oxygen plasma would be more serious. According to a further advantageous feature of this invention, polycarbonates having therein Si may be added in a large amount, since they have good mutual solubility with the polysiloxane which is the main component of the resin composition of this invention.

EXAMPLE 17

A commercially available resist (AZ-1350, produced by Sipley Corp.) was coated on a silicon wafer to form a 2 micron coating which was heated to 200° C. for 30 minutes. The AZ resist coating was overcoated with the resist material described in Example 13 in a manner substantially similar to that employed in Example 13, whereby a thin coating having a thickness of about 0.2 micron was formed. The thin overcoating was pre-baked at 80° C. for 20 minutes, and then exposed to an electron beam. The exposed resist coating was then developed using a developing solution having the same composition as that used in Example 13. A pattern was formed on the AZ resist coating. The AZ resist coating was then etched, while utilizing the resist pattern made from the resin composition of this invention as a resist pattern, by $O_2$ (etchant gas) in a parallel plate type sputter etching apparatus. The conditions at the etching step were that the RF power was 0.2 W/cm$^2$, that the $O_2$ gas pressure was 20 milli-torr, and that the time for etching operation was 15 minutes. As the result of etching, the portion of the AZ resist uncovered with the resist pattern had been completely removed. While using the resist material as described in Example 13, a 0.5 $\mu$m line-and-space pattern and having the coating thickness of about 2 microns could be formed.

EXAMPLE 18

On a ceramic substrate formed was a first conductive pattern layer through a conventional additive process. As an illustrative example, the conductive pattern formed in this Example had a pattern width of 30 microns, a pad diameter of 50 microns and a thickness of 5 microns. Separately, each of the polymers prepared by Preparation Examples 1 to 9 was dissolved in ethyl acetate cellosolve and added with 20 wt% of the derivative of ortho-diazonaththoquinone, which was used in Example 1 and served as a dissolution inhibitor. The thus prepared solution of each resin composition was coated through spin coating technology to from a 5 micron thick coating which was pre-baked at 80° C. for 20 minutes. Thereafter, the coating was exposed to UV through a photo-mask from the UV irradiation from Jet Light produced and sold by Oak Co. After exposure to UV, the exposed pattern was developed with a developing solution prepared by mixing water with a commercially available developer, Microposit 2401 (produced by Sipley Corp.) in a mixing ratio of 1:1. The substrate carrying the thus developed pattern was formed with via-holes, followed by further processing through conventional semi-additive process including electroless plating to form a 20 micron thick conductive pattern with the pad diameter of 20 microns and a diameter of each via-holes of 20 microns. A Multi-layered printed circuit board could be produced by forming insulation layers and layers carrying circuits by repeating operation cycles.

What is claimed is:

1. A photosensitive resin composition adapted for forming a two-layer resist pattern when exposed to ultraviolet rays, said resin composition comprising:

a substituted alkali-soluble siloxane polymer represented by the following structural formula:

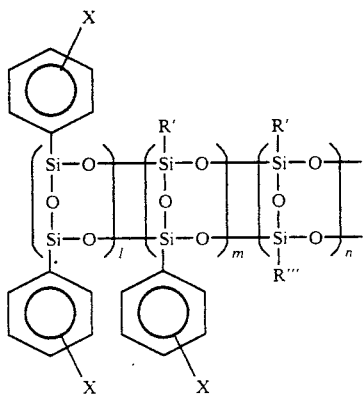

wherein X is $CH_3CO-$; R', R" and R''' are same or different groups and independently selected from the group consisting of hydroxyl and phenyl; and l, m and n are zero or positive integers with the restriction that l and m do not take zero concurrently;

an ortho-diazonapthoquinone compound in an amount of 5% by weight to 30% by weight of the siloxane polymers, in admixture in a solvent selected from the group consisting of ethylcellosolve acetate and ethylcellosolve.

2. A high energy beam sensitive resin composition adapted for forming a two-layer resist pattern when exposed to a high energy beam, said resin composition comprising:

a substituted alkali-soluble siloxane polymer represented by the following formula;

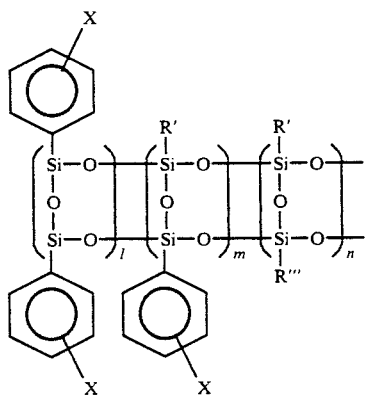

wherein X is $CH_3CO-$; R', R" and R''' are same or different groups and independently selected from the group consisting of hydroxyl and phenyl, and l, m and n are zero or positive integers with the restriction that l and m do not take zero concurrently, a combination of a second polymer and a third polymer which acts as a dissolution inhibitor in an amount of 5% by weight to 30% by weight of the siloxane polymer, said second or third polymer being selected from the group respectively consisting of second polymer;

said polymer each having a repeating unit represented by the formula of

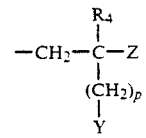

wherein $R_4$ is hydrogen or alkyl or phenyl; Y is alkyl or silyl; Z is $-SO_2-$ or $O-COO$; and p is zero or a positive integer, third polymer;

said polymer each having a repeating unit represented by the formula of

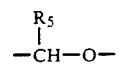

wherein $R_5$ is hydrogen, alkyl, phenyl or alkyl containing silicon in admixture in a solvent selected from the group consisting of ethylcellosolve acetate and ethylcellosolve.

3. The photosensitive resin composition as set forth in claim 1, wherein said ortho-diazonaphthoquinone compound is represented by the general structural formula of:

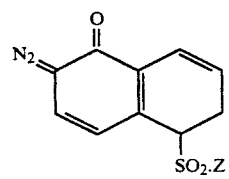

wherein Z is selected from the group consisting of:

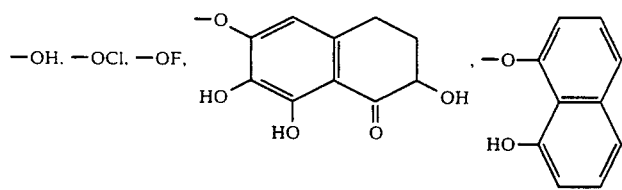
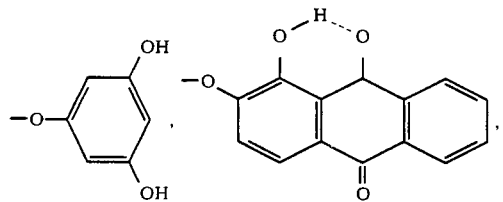
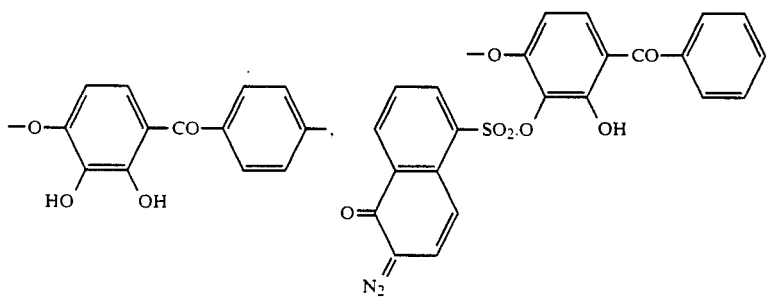
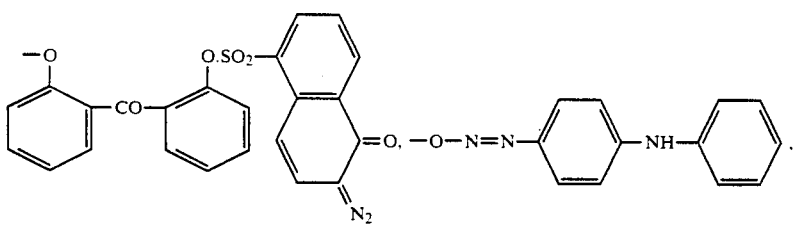
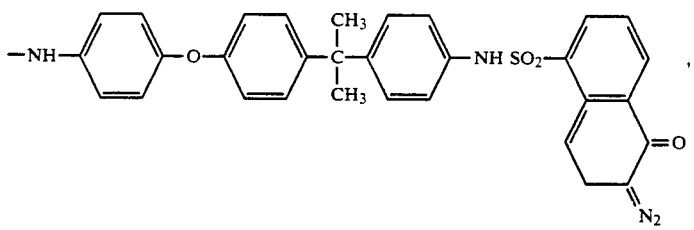
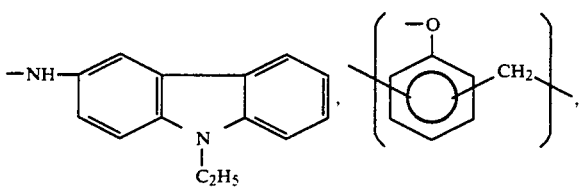

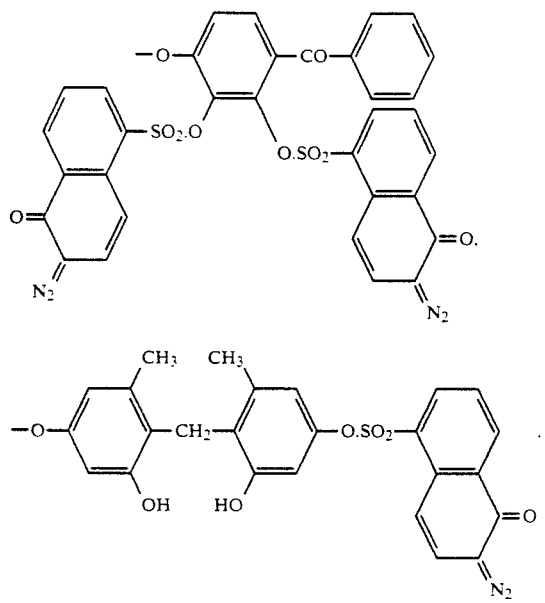

4. The high energy beam sensitive resin composition as set forth in claim 2, wherein said dissolution inhibitor is selected from the group of polyethers consisting of:
polybutenesulfone,
polymethylpentenesulfone,
polytrimethylsilylvinylsulfone,
polycarbonates which are condensation polymerization products of 2,5-dimethylhexane-2-5-diol and p-benzenedimethanol
silicon-containing polycarbonates,
polycarbonates obtained by the reaction between ethylene oxide and $CO_2$,
polyethers produced by polymerization of formaldehyde,
polyethers produced by polymerization of acetoaldehyde,
polyethers produced by polymerization of hexanal and
polyethers produced by polymerization of 3-trimethylsilylpropanal.

5. The high energy beam sensitive resin composition as set forth in claim 4, wherein said silicon-containing polycarbonate is selected from the group consisting of:
α-trimethylsilyl-ethylene polycarbonate,
β-trimethylsilylisopropylene polycarbonate,
α-triethylsilyl-ethylene polycarbonate, copolymers of α-trimethylsilyl-ethylene carbonate and β-trimethylsilylisopropylene carbonate, copolymer of α-trimethylsilyl-ethylene carbonate and α-triethylsilyl-ethylene carbonate.

* * * * *

UNITED STATES PATENT AND TRADEMARK OFFICE
CERTIFICATE OF CORRECTION

PATENT NO. : 5,158,854
DATED : October 27, 1992
INVENTOR(S) : Saburo Imamura et al It is certified that error appears in the above-identified patent and that said Letters Patent is hereby corrected as shown below:

Title page, Section [56] References Cited, under "U.S. PATENT DOCUMENTS", delete "4,600,285" and insert --4,600,685--.

Title page, Section [56] References Cited, under "FOREIGN PATENT DOCUMENTS" insert

```
--0191245      9/1985    Japan      430/270
  1238062     10/1986    Japan      430/270
  0198446     11/1984    Japan      430/270
  3544165      6/1986    Denmark    430/270--.
```

Column 4, line 66, delete "detriorated" and insert --deteriorated--.

Column 7, line 57, delete "ortho-azonaphthoquinone" and insert --ortho-diazonaphthoquinone--.

Signed and Sealed this

Twenty-seventh Day of September, 1994

Attest:

BRUCE LEHMAN

Attesting Officer     Commissioner of Patents and Trademarks